United States Patent [19]

Fujiyama

[11] Patent Number: 4,709,656
[45] Date of Patent: Dec. 1, 1987

[54] LAYER FORMING APPARATUS

[75] Inventor: Yasutomo Fujiyama, Tokyo, Japan

[73] Assignee: Canon Kabushiki Kaisha, Tokyo, Japan

[21] Appl. No.: 798,188

[22] Filed: Nov. 14, 1985

[30] Foreign Application Priority Data

Nov. 21, 1984 [JP] Japan ................. 59-244376

[51] Int. Cl.$^4$ ........................................ B05D 3/06
[52] U.S. Cl. ................. 118/723; 118/50.1; 118/730
[58] Field of Search ............ 118/728, 729, 730, 723, 118/620, 50.1

[56] References Cited

U.S. PATENT DOCUMENTS 4,576,830  3/1986  Kiss .............................. 118/729
4,582,720  4/1986  Yamazaki ....................... 118/729
4,593,644  6/1986  Hanak ............................ 118/729

FOREIGN PATENT DOCUMENTS

59-100265  6/1984  Japan .......................... 118/50.1

Primary Examiner—John H. Newsome
Attorney, Agent, or Firm—Fitzpatrick, Cella, Harper & Scinto

[57] ABSTRACT

There is disclosed layer forming apparatus for forming a deposition layer on a substrate by means of electric discharge, comprising a supporting electrode, and a cassette of a structure capable of accommodating therein a substrate for layer formation and being inserted into said supporting electrode and electrically connected therewith to cause electric discharge in said cassette.

1 Claim, 12 Drawing Figures

LAYER FORMING APPARATUS

BACKGROUND OF THE INVENTION

1. Field of the Invention

The present invention relates to a layer forming apparatus for forming a deposition layer on a substrate.

2. Description of the Prior Art

Figure 1:
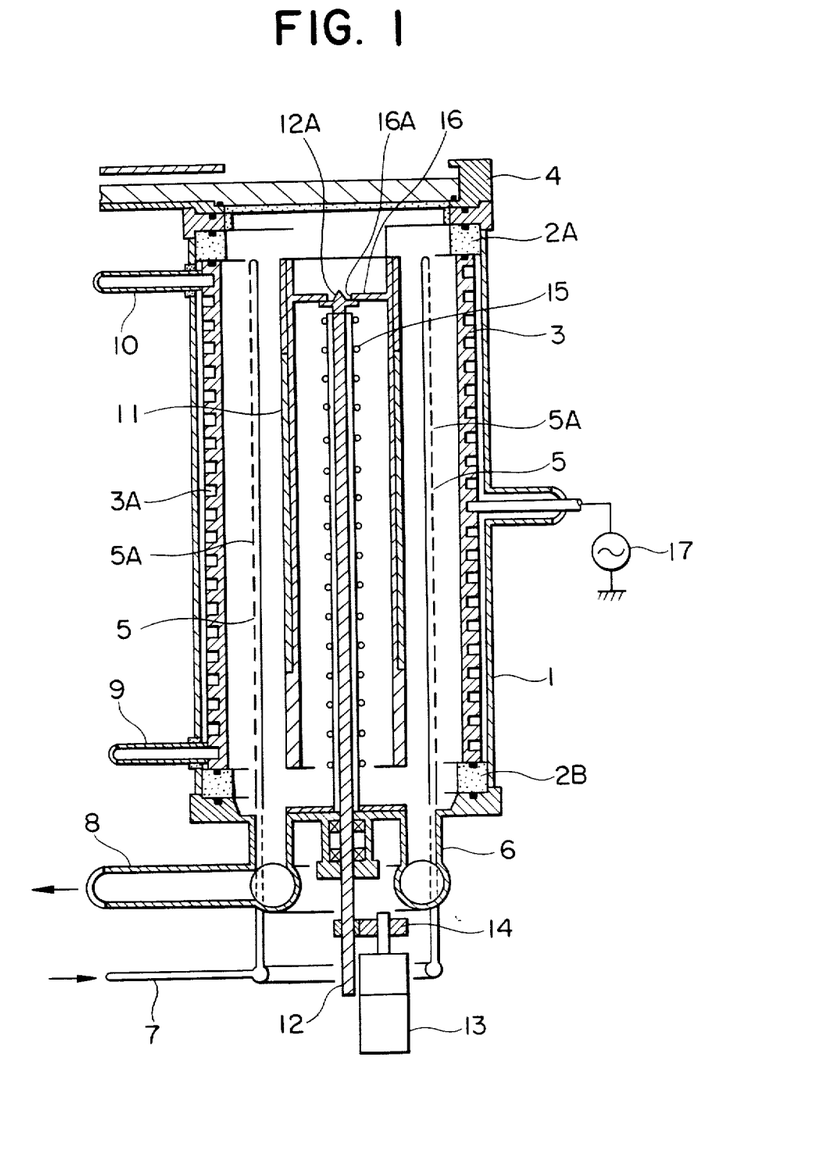
FIG. 1 is a cross-sectional view of a conventional layer forming apparatus.

As an apparatus for forming a deposition layer on a substrate, for example for the purpose of efficiently producing an electrophotographic photosensitive drum, there is already known a structure as will be explained in the following in relation to FIG. 1.

A cylindrical sealed box 1 is provided therein with a coaxial cathode electrode 3 supported by means of annular insulators 2A, 2B, and is equipped at the upper end with a gate valve 4. Inside said cathode electrode 3 there are provided plural vertical gas emission pipes 5 for a gaseous reagent, of which lower ends penetrate the lower end of the sealed box 1 and are connected to a gas introducing pipe 7. Each of said gas emission pipes 5 is provided, in the sealed box 1, with plural gas emission holes 5A facing the cathode 3, so that a gaseous reagent from an gas source (not shown) is supplied through the gas introducing pipe 7 to the gas emission pipes 5 and is emitted inside the cathode 3 through said gas emission holes 5A. In the bottom of the sealed box 1, there open plural gas exhaust pipes 6, of which the other ends are connected to a gas exhaust main pipe 8 in turn connected to gas discharge means (not shown), so that the gas in the sealed box 1 is discharged by said discharge means through said gas exhaust pipes 6 and said gas exhaust main pipe 8.

The cathode 3 is provided, on the external periphery thereof, with a spiral groove 3A, which is connected to a supply pipe 9 and a discharge pipe 10 for cooling water respectively at the lower and upper ends. The cathode 3 is therefore cooled by supplying cooling water from the supply pipe 9 into the groove 3A and discharging it from the discharge pipe 10.

A cylindrical substrate 11 for the electrophotographic photosensitive drum is supported inside the cathode coaxially with the same, by engaging a support plate 16, formed in the upper part of said substrate, with a head 12A at the upper end of a rod 12 positioned on the central axis of the cathode 3. The cylindrical substrate 11 is grounded through the rod 12, while the cathode 3 is connected to an RF power source 17. Outside the rod 12, and inside the cylindrical substrate 11, there is provided a heater 15 fixed to the bottom of the sealed box 1. The lower end of the rod 12 is linked, under the lower end of the sealed box 1, to a motor 13 through a reducing mechanism 14, whereby the cylindrical substrate 11 is rotated by said motor 13. Though not illustrated, the interior of the sealed box 1 is evacuated by gas discharge means.

The above-described structure can deposit, for example, a layer of amorphous silicon on the external periphery of the cylindrical substrate 11, by at first evacuating the interior of the sealed box 1, then emitting a gaseous reagent into the sealed box 1 through the gas emission pipes 5, turning on the heater, rotating the cylindrical substrate 11 and supplying a high-frequency electric power from the RF power source 17 to the cathode 3 thereby causing a discharge between the cathode and the cylindrical substrate 11.

The above-described conventional layer forming apparatus is, however, associated with the following drawbacks.

Decomposition of gaseous reagent causes deposition of a polysilane layer also on the internal periphery of the cathode 3 and the sealed box 1, and such polysilane layer has to be removed after each layer formation, by means for example of dry etch cleaning. However such dry etch cleaning requires a long time, for example about 2 hours, thus significantly deteriorating the production efficiency of the electrophotographic photosensitive drums. Said dry etch cleaning for example employs a gaseous mixture of $CF_4$ and oxygen, which are decomposed in high-frequency plasma to gasify the polysilane film deposited on the internal periphery of the cathode etc. Thus, in order to withstand strongly corrosive gasses generated in the dry etch cleaning process, the cathode, gas emission tubes etc. have to be made of anticorrosive materials, use of which inevitably increases the cost of the apparatus. In addition, the cost of the gasses to be employed in the cleaning process has to be considered. These factors have lead to a high cost of layer formation.

SUMMARY OF THE INVENTION

An object of the present invention is to provide a layer forming apparatus which is not associated with the foregoing drawbacks and is capable of providing an extremely high production efficiency.

Another object of the present invention is to provide a layer forming apparatus for forming a deposition layer on a substrate by means of electrical discharge, comprising a supporting electrode and a cassette which can accommodate the substrate therein and is inserted in and electrically connected with said supporting electrode to cause electrical discharge inside said cassette.

DETAILED DESCRIPTION OF THE PREFERRED EMBODIMENTS

Figure 2:
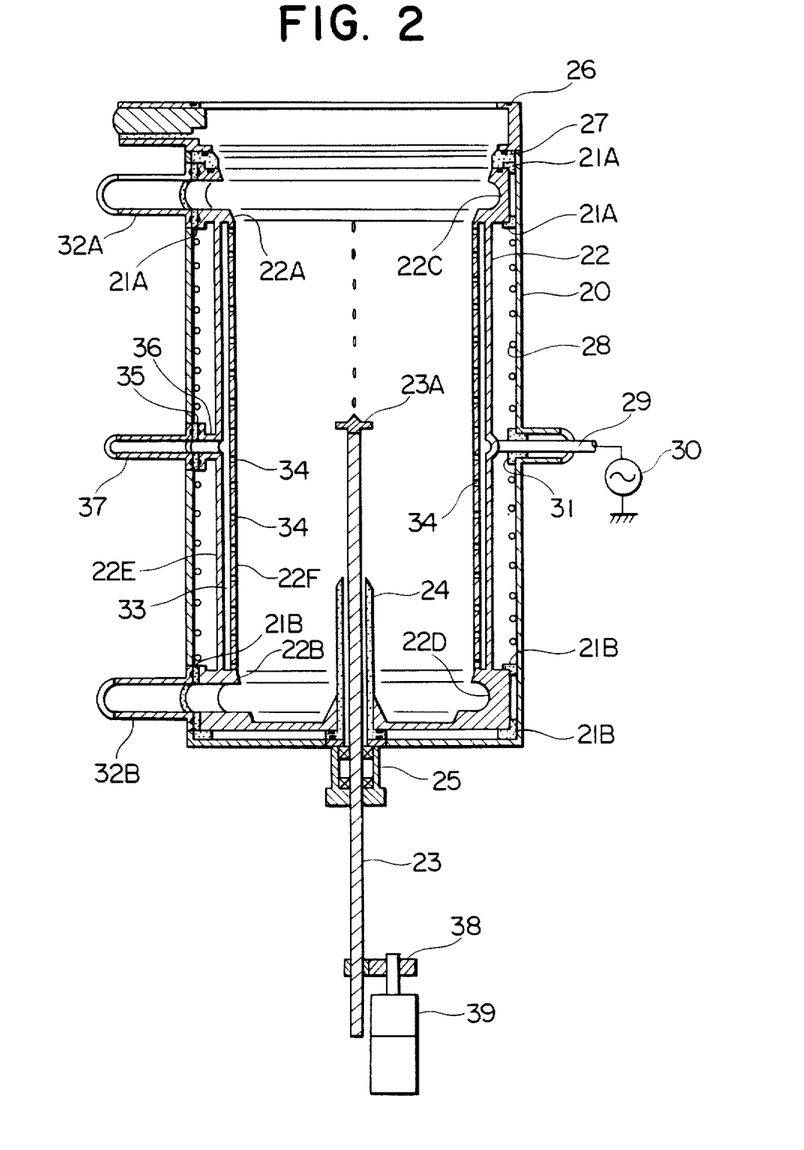
FIG. 2 is a cross-sectional view of a supporting electrode in a first embodiment of the layer forming apparatus of the present invention.

FIG. 2 is a cross-sectional view of a supporting electrode in a first embodiment of the layer forming apparatus of the present invention, wherein a sealed box 20 is provided therein with a supporting electrode 22 of a bottomed cylindrical structure, supported by insulators 21A, 21B. The sealed box 20 is grounded while the supporting electrode 22 is insulated therefrom. In addition, said sealed box 20 is capable of preventing the leaking, to the outside, of the high frequency field supplied to the supporting electrode 22 as will be explained later.

A rod 23 is positioned on the central axis of the supporting electrode 22 and penetrates the bottoms of the sealed box 20 and of the supporting electrode 22, but is insulated therefrom by an annular insulator 24 positioned on the bottom of the sealed box 20 and penetrating the bottom of the supporting electrode 22. A sealing mechanism 25, positioned outside the bottom of the sealed box 20, forms a hermetic seal between the rod 23 and the sealed box 20.

A gate valve 26, positioned at the upper end of the sealed box 20, hermetically closes or opens an upper aperture thereof. An annular insulator 27 is provided between the gate valve 26 and the insulator 21A, in order to form a hermetic seal therebetween. In this manner, the supporting electrode 22, or the sealed box 20, has a hermetrically sealed structure.

A heater 28 is provided along the internal periphery of the sealed box 20. A conductor 29, having an insulator 31 therearound and penetrating the sealed box 20, is connected at an end to the supporting electrode 22 and at the other end to an RF power source 30, whereby the supporting electrode 22 receives the high-frequency power from the RF power source 30 through said conductor 29.

The upper and lower ends of the internal periphery of the supporting electrode 22 are formed as tapered faces 22A, 22B, respectively provided with annular grooves 22C, 22D of a semi-circular cross-section. Gas exhaust pipes 32A, 32B are connected respectively to the upper and lower ends of the sealed box 20 and communicate, through the insulators 21A, 21B, with the annular grooves 22C, 22D formed in said upper and lower ends. The other ends of said pipes 32A, 32B are connected to gas discharge means.

The peripheral wall of the supporting electrode 22 has a double-wall structure, composed of an external wall 22E and an internal wall 22F, forming an annular space 33 therebetween. The internal wall 22F is provided with plural rows of radial gas emission holes 34, distributed at a regular interval along the circumference.

A gas supply pipe 37 is fixed at an end to the sealed box 20 and communicates, through a connection pipe 36 and an insulator 35, fixed to the external wall 22E of the supporting electrode 22, with said annular space 33. The other end of said gas supply pipe 37 is connected to a gas source (not shown), whereby the gaseous reagent therefrom is supplied into said annular space 33 through the gas supply pipe 37, insulator 35 and connection pipe 36.

The rod 23 is linked with and rotated by a motor 39 through a reducing mechanism 38. The motor 39 is fixed on unrepresented elevator means, by the rod 23 can move along the central axis of the supporting electrode 22.

Figure 3:
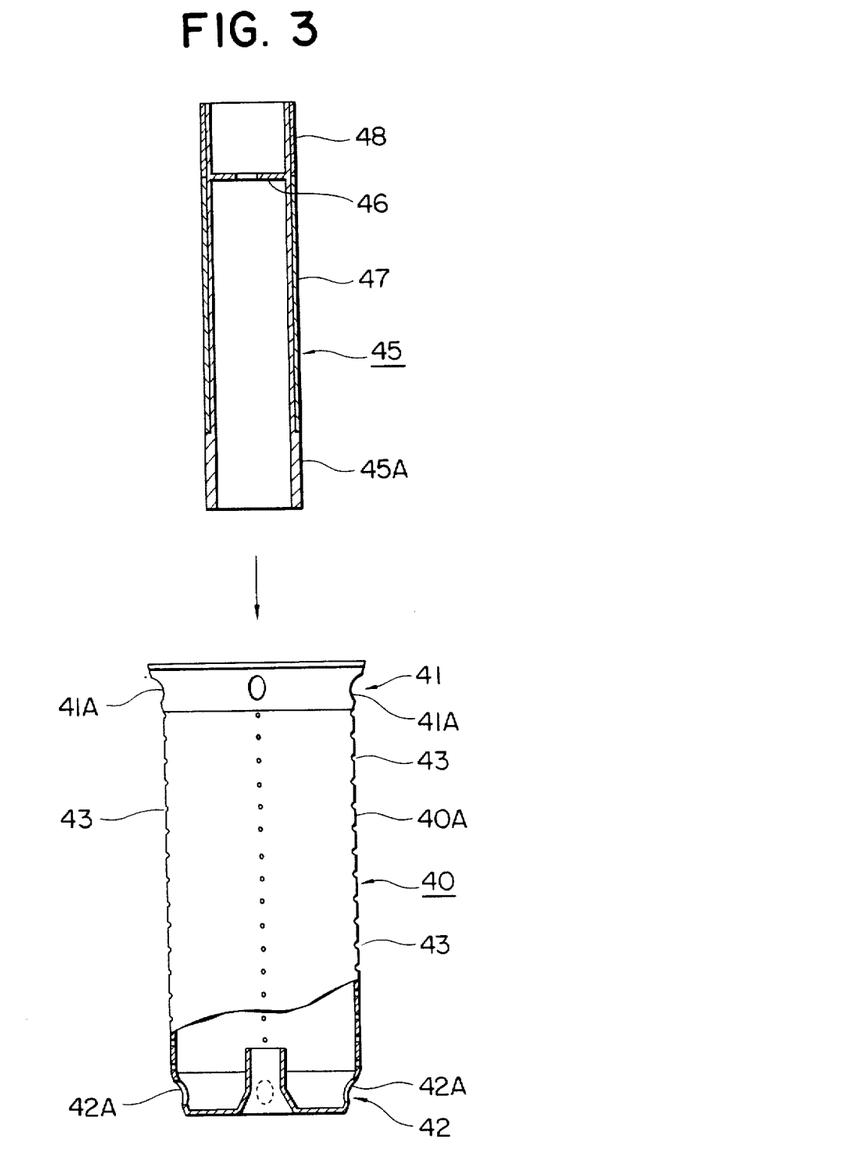
FIGS. 3, 4 and 5 are detailed views of a cassette of a hollow canister-like structure and a cylindrical substrate.
Figure 4:
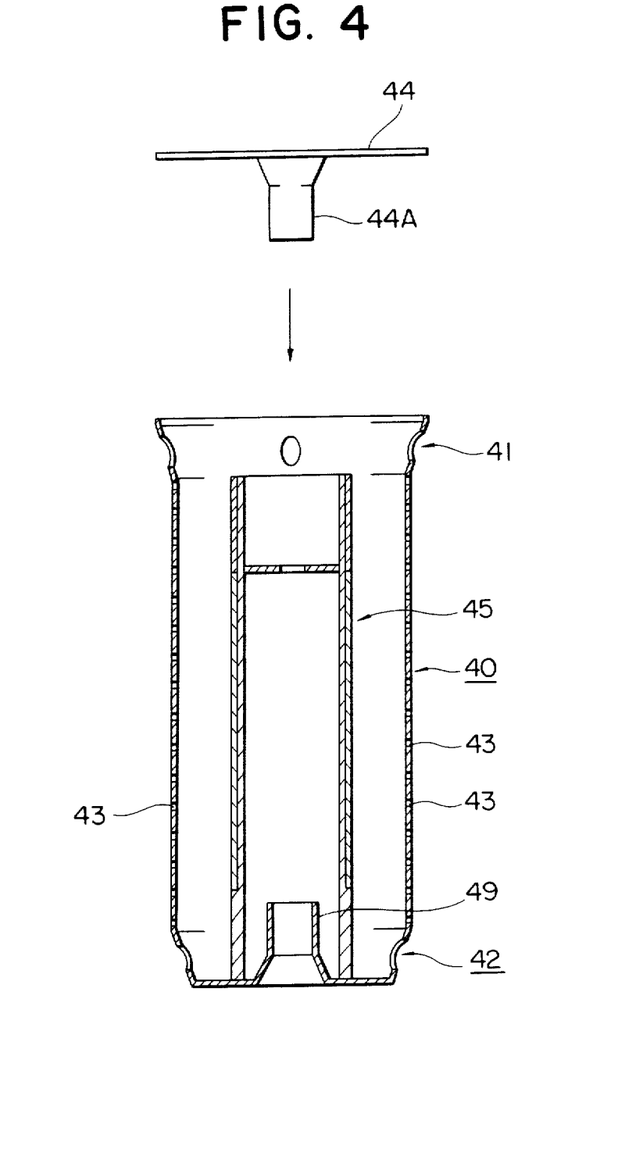
Figure 5:
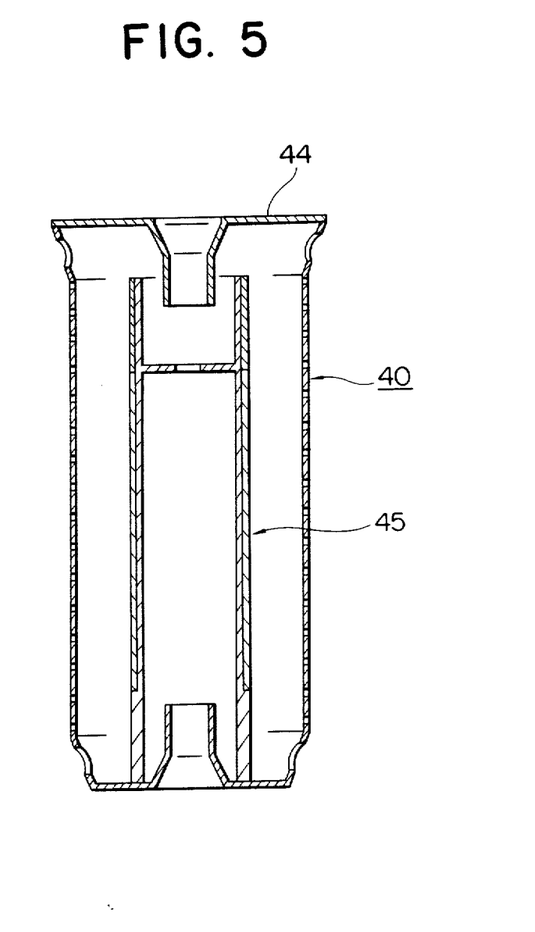

FIGS. 3, 4 and 5 illustrate the details of a cassette of a hollow canister-like structure and a support member for the substrate.

As shown in FIG. 4, a cassette 40 is composed of a main body 40A and a cover 44. As will be seen in FIG. 3, the main body 40A of the cassette has a cylindrical structure with a bottom, having gas discharge portions 41, 42 respectively at the upper and lower end portions. Said gas discharge portions 41, 42 are so tapered that they will be in intimate contact with the entire internal periphery at the upper and lower ends of the supporting electrodes 22, and are provided with plural penetrating holes 41A, 42A distributed at a determined spacing along the circumference.

The main body 40A of the cassette is further provided, in a portion excluding the gas discharge portions 41 and 42, with plural longitudinal rows of gas emission holes 43, distributed at a determined spacing along the circumference. The external diameter of said main body 40A is approximately equal to the internal diameter of the supporting electrode 22, and the gas emission holes 43 are so positioned on the main body 40A that they will approximately correspond to the gas emission holes 34 formed in the internal wall 22F of the supporting electrode 22, when the cassette 40 is inserted therein as will be explained later. The cassette 40 is formed by a conductive material, conveniently aluminum.

A support member 45 for the cylindrical substrate is provided with a support plate 46 at an internal upper part of a main body 45A, and is adapted to detachably support a cylindrical substrate 47 for the electrophotographic photosensitive member, on the external periphery of said main body 45A. Said cylindrical substrate 47 is supported at the lower and upper ends respectively by a shoulder formed at the lower portion of the main body 45A and by an annular support member 48 fitted on the upper outside of said main body 45A and is thus fixed thereon. The cylindrical substrate can be removed from the main body 45A by removing said support member 48 from said main body 45A.

The cover 44 is fitted to the gas discharge portion 41 to close the upper aperture of the main body 40A. Said cover 44 is provided, at the center thereof, with a tubular projection 44A. A similar projection 49 is also formed at the center of the bottom of the cassette main body 40A, and each of said projection 44A and 49 is composed of a tapering portion and a straight tubular portion. The cover 44 can be coupled to the upper end of the main body 40A by means of the known process for manufacturing cans.

The substrate support member 45, bearing the cylindrical substrate 47, is suitably suspended and inserted into the cassette main body 40A through the aperture at the upper end thereof, until the lower end of the support member rests on the bottom of said main body 40A, as shown in FIG. 4. In this insertion the central axis of the support member 45 is made to coincide with that of the cassette main body 40A. Then, the cover 44 is coupled to the upper end of the cassette main body 40A. In this manner, the substrate support member 45, bearing the cylindrical substrate 47, is accommodated in the cassette 40 as illustrated in FIG. 5.

Then, the cassette 40, accomodating the substrate support member 45 therein, is inserted in the supporting electrode 22 as will be explained in the following.

Figure 6:
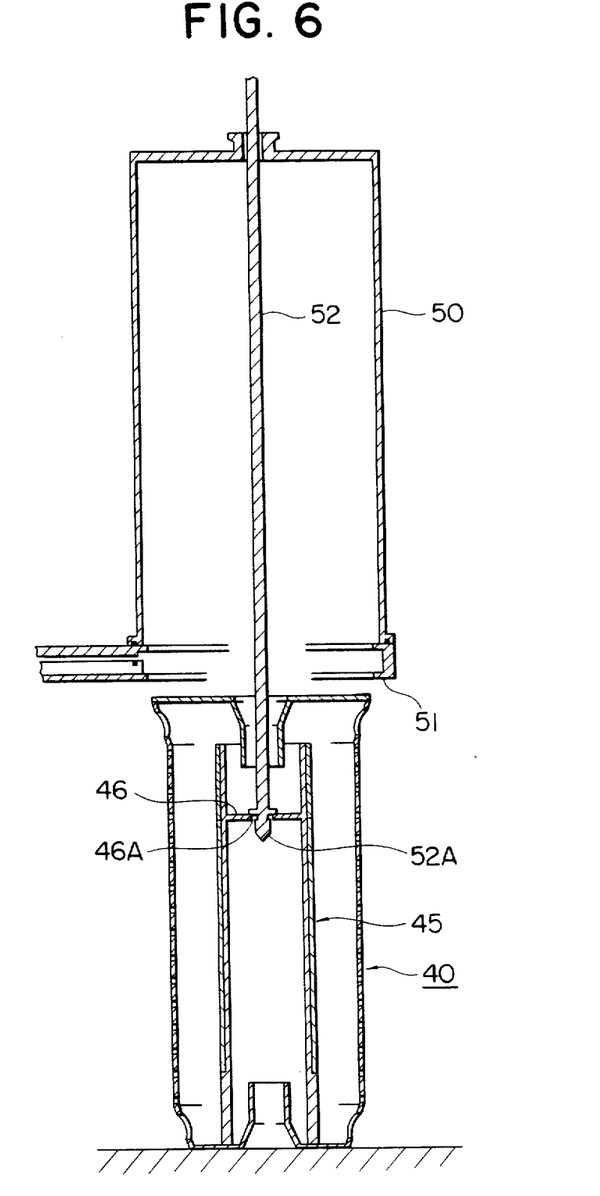
FIGS. 6 and 7 are cross-sectional views of a conveyor chamber and a cassette.
Figure 7:
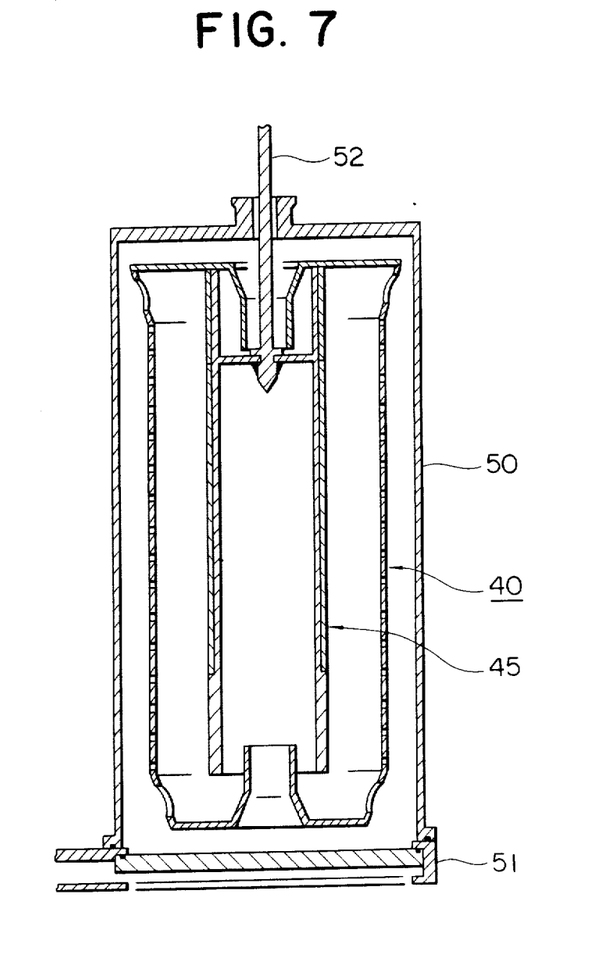

For this purpose, the cassette 40 is housed in a conveyor chamber 50 as shown in FIGS. 6 and 7. As shown in FIG. 6, the conveyor chamber 50 is provided with a gate valve 51 for closing the aperture at the lower end of said chamber. The interior of said chamber 50 can be evacuated to a reduced pressure by means of unrepresented gas discharge means, after said gate valve 51 is closed. A suspending rod 52, positioned on the central axis of the conveyor chamber 50, hermetically penetrates a ceiling thereof. Above said ceiling of the conveyor chamber, there is provided unrepresented elevator means, by which the suspending rod can move vertically. The conveyor chamber 50 is suspended by suitable suspending means, by which said chamber 50 can be positioned above the sealed box 20 at a determined position, as will be explained later.

As shown in FIG. 6, the conveyor chamber 50 is positioned directly above the cassette 40, placed at a determined position and accomodating the substrate support member 45 bearing the cylindrical substrate. The front end of the suspending rod 52 is positioned inside the conveyor chamber 50. Then, said suspending rod 52 is lowered as shown in FIG. 6, and a chuck 52A at the front end of said rod is made to engage with a hole 46A of the supporting plate 46 of the substrate support member 45, through the projection 44A of the cassette cover 44. Subsequently, the suspending rod 52 is elevated, whereby the substrate support member 45 is lifted together with the rod 52 until the upper end of said member comes into contact with the cover 44. In this state, the cassette 40 itself is lifted, and said cassette and the substrate support member 45 are housed in the conveyor chamber 50 as shown in FIG. 7. Then, the gate valve 51 is closed and the interior of said chamber 50 is maintained at a reduced pressure.

Then, the conveyor chamber 50, holding the cassette 40 therein, is positioned directly above the sealed box 20 maintained in advance at a reduced pressure, in such a manner that the gate valve 51 at the lower end of the conveyor chamber 50 is placed on the gate valve 26 at the upper end of the sealed box 20, with mutually coinciding central axes.

Figure 8:
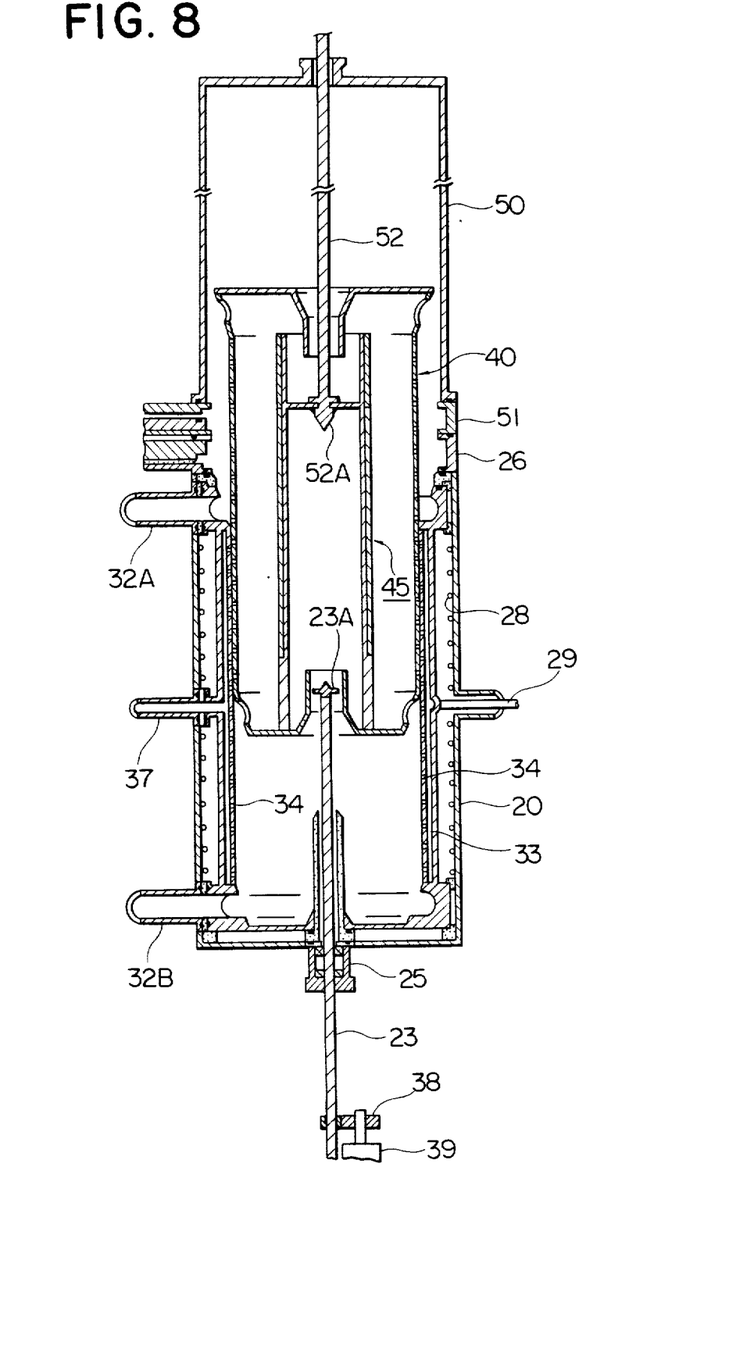
FIGS. 8, 9 and 10 are cross-sectional views showing the function of the above-mentioned embodiment.
Figure 9:
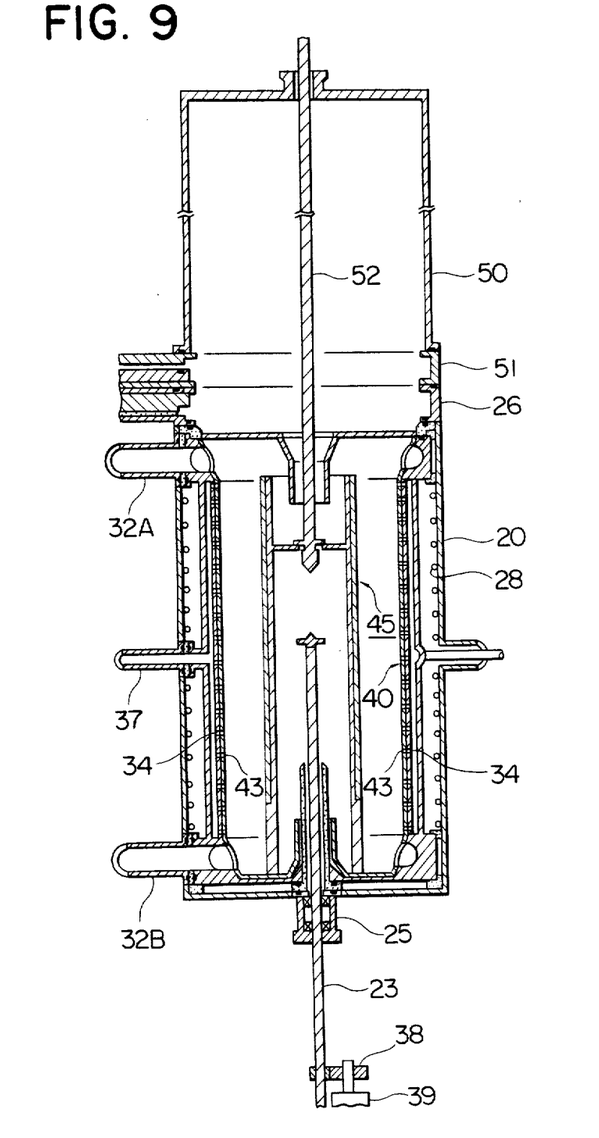

Subsequently, the space between two gate valves 26, 51 is evacuated by suitable means (not shown) to a reduced pressure, and said gate valves are opened. Then, as shown in FIG. 8, the suspending rod 52 is lowered to insert the cassette 40 into the supporting electrode 22. In this operation, the rod 23 is lowered to a suitable position in the supporting electrode 22, until the bottom of the cassette 40 comes into contact with the bottom of the supporting electrode 22 as shown in FIG. 9. In this state the cassette 40 is in intimate contact with the supporting electrode 22 over the entire internal surface thereof. More specifically, the tapered surfaces at the upper and lower ends of the cassette 40 are in intimate contact with the tapered faces 22A, 22B at the upper and lower ends of the supporting electrode 22 over their respective entire circumferences, while the remaining portion of the cassette 40 is in intimate contact with the corresponding internal wall of the supporting electrode 22 over the entire circumference, and the gas emission holes 43 formed in its cassette 40 communicate with those 34 formed in the supporting electrode 22. Consequently, the gaseous reagent is supplied through the gas supply pipe 37, insulator 35 and connection pipe 36 to the annular space 33, from which it is supplied into the cassette 40 through the gas emission holes 34 and 43. The gas in the cassette 40 is discharged, through the gas discharge portions 41A, 42A at the upper and lower ends thereof to the annular grooves 22C, 22D at the upper and lower ends of the supporting electrode 22, from which it is discharged through the gas exhaust pipes 32A, 32B.

Figure 10:
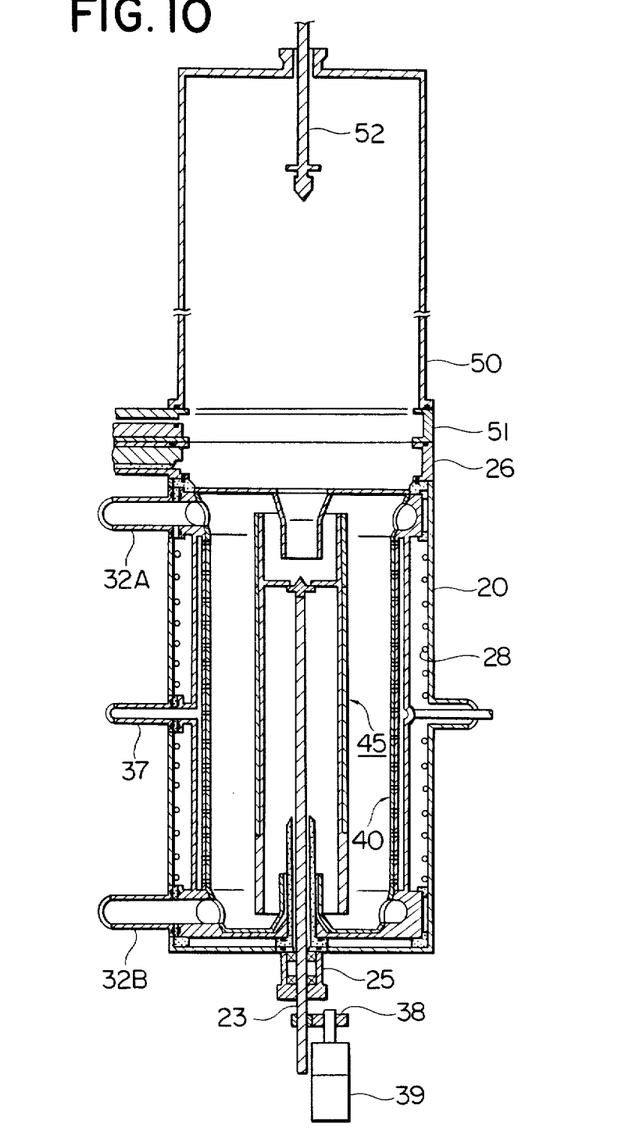

Then, the chuck 52A at the lower end of the suspending rod 52 is disengaged from the hole 46A of the supporting plate 46 of the substrate support member 45, and said suspending rod 52 is lifted into the conveyor chamber 50, while the rod 23 is elevated until the head 23A at the upper end thereof comes into contact with the supporting plate 46. Then the rod 23 is further elevated to lift the substrate support member 45 from the bottom of the cassette 40, thus insulating said support member 45 from the cassette, as shown in FIG. 10.

Subsequently, the gate valve 26 at the upper end of the sealed box 20 is closed, and the conveyor chamber 50 is transferred from a position above said sealed box 20 to another location. In this manner, the cassette 40 is electrically contacting the supporting electrode 22 to constitute a cathode, while the substrate support member 45 insulated in the cassette 40 is grounded through the rod 23.

The substrate supporting member 45, bearing the cylindrical substrate, is housed in the supporting electrode 22 as explained above. Thus, a layer for example of amorphous silicon can be deposited on the external periphery of the cylindrical substrate, by rotating said substrate support member 45 by means of the rod 23, supplying a gaseous reagent through the gas supply pipe 37, insulator 35, connection pipe 36, annular space 33, gas emission holes 34 and 43 into the cassette 40 maintained in advance at a reduced pressure, heating the interior of the cassette 40 to a desired temperature by means of the heater 28 and supplying a high-frequency electric power to the supporting electrode 22 and the cassette 40. Deposition of polysilane, etc. occurs also inside the cassette 40 but not on the supporting electrode 22 nor on the gate valve 26. Besides the powder of polysilane, etc. eventually peeling from the inside of the cassette 40 accumulates on the bottom of the cassette 40 and does not leak therefrom. Absence of deposition of polysilane, etc. on the fixed parts such as the supporting electrode 22 dispenses with the cleaning operation therefor, and enables an extremely efficient operation of the apparatus since the next layer formation can be immediately initiated by merely replacing the cassette.

Figure 11:
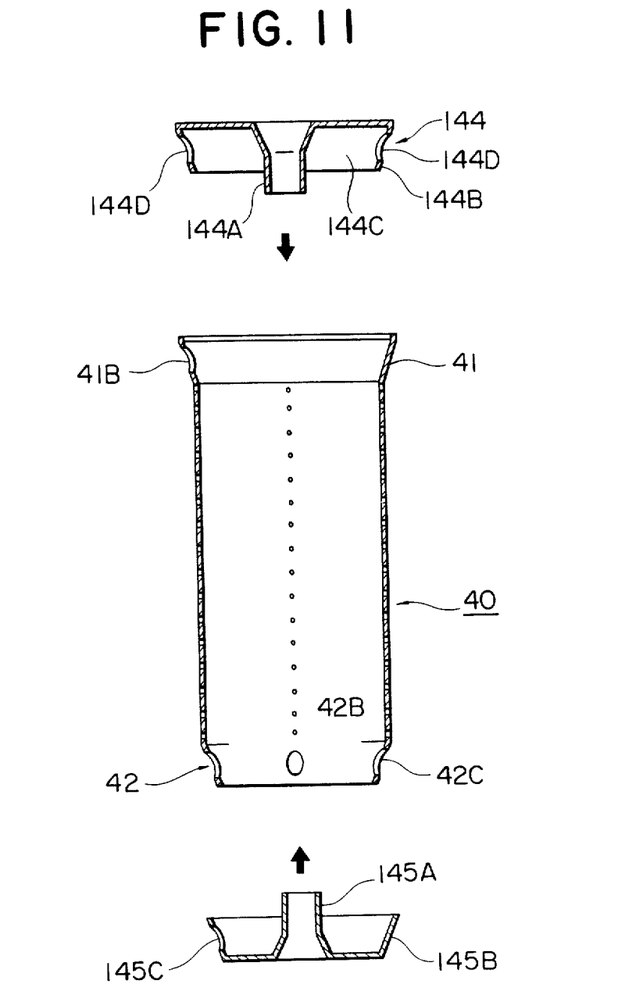
FIG. 11 is a schematic view of a cassette for use in a second embodiment of the present invention.
Figure 12:
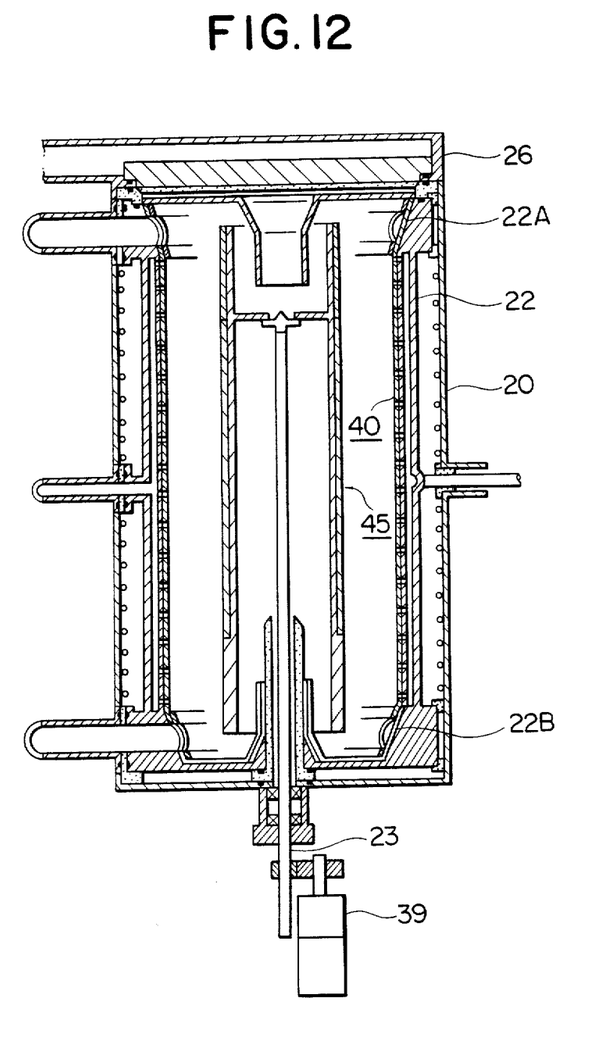
FIG. 12 is a cross-sectional view showing the second embodiment of the layer forming apparatus of the present invention.

FIGS. 11 and 12 illustrate a second embodiment of the present invention, wherein a cassette 40 is provided, as shown in FIG. 11, with a penetrating hole 41B in a part of a gas discharge portion 41, and is adapted to accept a cover 144 at the upper aperture. Said cover 144 is provided, at the center thereof with a projection 144A in a similar manner as in the aforementioned cover 44, and is further provided, along the periphery thereof, with a tapering portion 144B which is to fit along the entire circumference with the internal tapering face of the gas discharge portion 41 at the upper end of the cassette 40 and which is further provided with a circumferential annular groove 144C having four holes 144D. The lower end of the cassette 40 is left open, and a tapering face of the gas discharge portion 42 thereof is provided with a circumferential annular groove 42B having four holes 42C. Said lower end of the cassette 40 is to be fitted with a cover 145 which is provided at the center thereof with a projection 145A similar to the above-mentioned projection 49, and is circumferentially provided with a tapering face 145B to be in contact with the tapering face of the gas discharge portion 42 along the entire circumference when combined to the lower end of the cassette 40. Said tapering face 145B is provided with a penetrating hole 145C at a position. The cover 145 is so positioned, when coupled to the cassette 40, that the penetrating hole 145C lies on a line that is parallel to the central axis of the cassette 40 and passes the hole 41B at the upper end of the cassette 40. A supporting electrode to be used in combination with such cassette 40 is provided, as shown in FIG. 12, with tapering faces 22A, 22B at the upper and lower ends, which are to be contacted with the tapering faces at the upper and lower ends of the cassette 40. The penetrating holes 41B, 145C formed at the upper and lower ends of the cassette 40 are so positioned as to meet the communicating positions of the gas exhaust pipes 32A, 32B at the upper and lower ends of the supporting electrode 22. Also in such structure, the gas in the cassette 40 is discharged through the upper and lower holes 144D, 42C to the annular grooves 144C, 42B, from which it is further discharged through the penetrating holes 41B, 145C to the gas exhaust pipes 32A, 32B. The above-described structure further reduces the contact area of the supporting electrode 22, or the fixed part of the apparatus, with the gaseous reagent.

As explained in the foregoing, the layer forming apparatus of the present invention avoids the deposition of polysilane etc. onto the main body of the apparatus through the use of a cassette structure for supporting a substrate. Consequently it is rendered possible to dispense with the cleaning operation and to repeat the layer forming operation by merely replacing said cassette, thus significantly reducing the entire time required for layer formation and achieving efficient layer formation.

What is claimed is:

1. A layer forming apparatus comprising:
   a conveyor chamber including:
     a space for receiving a cassette, said cassette having means for receiving a substrate on which a film is to be formed;
     loading means for inserting and removing the cassette in and out of the space in said conveyor chamber; and
     first gate valve means for allowing the cassette to be inserted into or removed from the space in said conveyor chamber, and enabling said conveyor chamber to be sealed airtight; and
   a film forming chamber including:
     a space for receiving the cassette being defined by an interior surface wall of said film forming chamber, said interior surface constituting a wall electrode;
     positioning means for positioning the cassette at a predetermined position in the space of said film forming chamber;
     electrode means electrically connected to said wall electrode;
     gas introduction means formed in said wall for introducing gas into said film forming chamber;
     gas supply means connected to the gas introduction means for supplying reaction gas into the space formed in said film forming chamber; and
   second gate valve means for allowing the cassette to be moved between said chambers while maintaining said film forming chamber airtight, the moving of said cassette between said conveyor chamber and said film forming chamber being perfored by opening said first and second gate valve means without allowing atmosphere to enter either chamber.

* * * * *

UNITED STATES PATENT AND TRADEMARK OFFICE
CERTIFICATE OF CORRECTION

Page 1 of 2

PATENT NO. : 4,709,656
DATED : December 1, 1987
INVENTOR(S) : Yasutomo Fujiyama

It is certified that error appears in the above-identified patent and that said Letters Patent is hereby corrected as shown below:

COLUMN 1
Line 25, "an" should read --a--.

COLUMN 2
Line 16, "cathode etc." should read --cathode, etc.--.
Line 67, "the" should be deleted.

COLUMN 3
Line 18, "hermetrically" should read --hermetically--.
Line 55, "by" should read --and--.

COLUMN 4
Line 1, "electrodes 22," should read --electrode 22,--.
Line 52, "accomodating" should read --accommodating--.

COLUMN 5
Line 5, "accomodating" should read --accommodating--.
Line 48, "the" should read --its--.
Line 49, "its" should read --the--.
Line 67, "Then the" should read --Then, the--.

COLUMN 7
Line 16, "polysilane etc." should read --polysilane, etc.--.

UNITED STATES PATENT AND TRADEMARK OFFICE
CERTIFICATE OF CORRECTION

PATENT NO. : 4,709,656

DATED : December 1, 1987

INVENTOR(S) : Yasutomo Fujiyama

It is certified that error appears in the above-identified patent and that said Letters Patent is hereby corrected as shown below:

COLUMN 8

Line 27, "perfored" should read --performed--.

Signed and Sealed this

Twenty-eighth Day of June, 1988

Attest:

DONALD J. QUIGG

Attesting Officer      Commissioner of Patents and Trademarks